(12) United States Patent
Fang et al.

(10) Patent No.: US 10,880,987 B2
(45) Date of Patent: Dec. 29, 2020

(54) CIRCUIT BOARD AND OPTICAL MODULE HAVING SUCH CIRCUIT BOARD

(71) Applicant: InnoLight Technology (Suzhou) LTD., Jiangsu (CN)

(72) Inventors: Xigui Fang, Jiangsu (CN); Zhenzhong Wang, Jiangsu (CN); Dengqun Yu, Jiangsu (CN); Zhanwei Wang, Jiangsu (CN); Shuming Zhu, Jiangsu (CN)

(73) Assignee: InnoLight Technology (Suzhou) Ltd., Suzhou (CN)

( * ) Notice: Subject to any disclaimer, the term of this patent is extended or adjusted under 35 U.S.C. 154(b) by 0 days.

(21) Appl. No.: 16/527,257

(22) Filed: Jul. 31, 2019

(65) Prior Publication Data
US 2020/0045806 A1 Feb. 6, 2020

(30) Foreign Application Priority Data

Aug. 1, 2018 (CN) .......................... 2018 1 0861266

(51) Int. Cl.
*H05K 1/02* (2006.01)
*H05K 1/18* (2006.01)

(52) U.S. Cl.
CPC ........... *H05K 1/0204* (2013.01); *H05K 1/181* (2013.01); *H05K 2201/09036* (2013.01); *H05K 2201/09063* (2013.01); *H05K 2201/09163* (2013.01); *H05K 2201/10416* (2013.01); *H05K 2201/10446* (2013.01)

(58) Field of Classification Search
CPC ................ H05K 1/0204; H05K 1/181; H05K 2201/09036; H05K 2201/09063; H05K 2201/09163; H05K 2201/10416; H05K 2201/10446; H05K 7/2039; H05K 7/205
See application file for complete search history.

(56) References Cited

U.S. PATENT DOCUMENTS

| | | | | |
|---|---|---|---|---|
| 6,151,215 A * | 11/2000 | Hoffman | ................ | H05K 1/144 165/104.33 |
| 6,916,122 B2 * | 7/2005 | Branch | ................ | G02B 6/4201 385/92 |
| 6,992,895 B2 * | 1/2006 | Lindberg | ............. | G02B 6/4277 257/724 |
| 8,292,519 B2 * | 10/2012 | Lee | ...................... | G02B 6/4201 385/92 |
| 9,148,286 B2 * | 9/2015 | Li | ........................... | G06F 21/31 |
| 2003/0034557 A1 * | 2/2003 | Gupta | ..................... | H01L 23/13 257/729 |

(Continued)

*Primary Examiner* — Jayprakash N Gandhi
*Assistant Examiner* — Michael A Matey
(74) *Attorney, Agent, or Firm* — Finnegan, Henderson, Farabow, Garrett & Dunner, LLP (57) ABSTRACT

A circuit board includes an upper surface, a lower surface, a first end surface connecting the upper surface and lower surface, and a heat dissipation block. The first end surface of the circuit board has an open slot, the open slot extending through the upper surface and lower surface, and the heat dissipation block being arranged inside the open slot. The heat dissipation block has a first surface, the first surface facing away from the lower surface of the circuit board and extending to the first end surface of the circuit board. The inside of the open slot has a stop structure, the stop structure preventing the heat dissipation block from moving toward the first end surface of the circuit board.

13 Claims, 7 Drawing Sheets

(56) References Cited

U.S. PATENT DOCUMENTS

| | | | |
|---|---|---|---|
| 2004/0075100 A1* | 4/2004 | Bogner | H01L 33/62 257/99 |
| 2006/0153506 A1* | 7/2006 | Cheng | G02B 6/4201 385/88 |
| 2008/0087456 A1* | 4/2008 | Schuette | H05K 1/0207 174/252 |
| 2008/0247168 A1* | 10/2008 | Chien | F21V 29/004 362/294 |
| 2009/0309213 A1* | 12/2009 | Takahashi | H01L 21/561 257/707 |
| 2012/0103663 A1* | 5/2012 | Kobayashi | H01L 23/3677 174/251 |
| 2013/0156385 A1* | 6/2013 | Ishigami | G02B 6/4236 385/92 |
| 2016/0088720 A1* | 3/2016 | Willis | H05K 1/0206 361/709 |
| 2016/0192533 A1* | 6/2016 | Fang | H05K 1/0204 361/709 |
| 2016/0192541 A1* | 6/2016 | Rech | H05K 7/20409 361/709 |
| 2018/0098414 A1* | 4/2018 | Davare | H01L 23/367 |
| 2018/0132348 A1* | 5/2018 | Berkel | H05K 3/4697 |
| 2018/0153030 A1* | 5/2018 | Viswanathan | H05K 1/0203 |
| 2018/0352646 A1* | 12/2018 | Yu | H01L 23/3731 |
| 2019/0082527 A1* | 3/2019 | Kita | H05K 1/0207 |
| 2019/0317285 A1* | 10/2019 | Liff | G02B 6/2938 |
| 2019/0377392 A1* | 12/2019 | Mani | H01L 23/13 |

* cited by examiner

CIRCUIT BOARD AND OPTICAL MODULE HAVING SUCH CIRCUIT BOARD

CROSS-REFERENCE TO RELATED APPLICATION

This application is based upon and claims priority to Chinese Patent Application 201810861266.3, filed on Aug. 1, 2018, the entire content of which is incorporated herein by reference.

FIELD OF THE DISCLOSURE

The present application relates to the field of circuit board technology and, more particularly, to a circuit board and an optical module having the circuit board.

BACKGROUND

Wire bonding technology between the edge of a printed circuit board (PCB) to a chip on ceramic (COC) (i.e., COP technology) is commonly used technology in optical modules, placing many requirements on the design of the PCB. For example, the technical solution of COP requires that a signal is bonded from the edge of a PCB to a silicon photonic integrated circuit (PIC). Moreover, as the speed of transmission increases, the chips consume more power, and the demand for bandwidth becomes higher.

Figure 1:
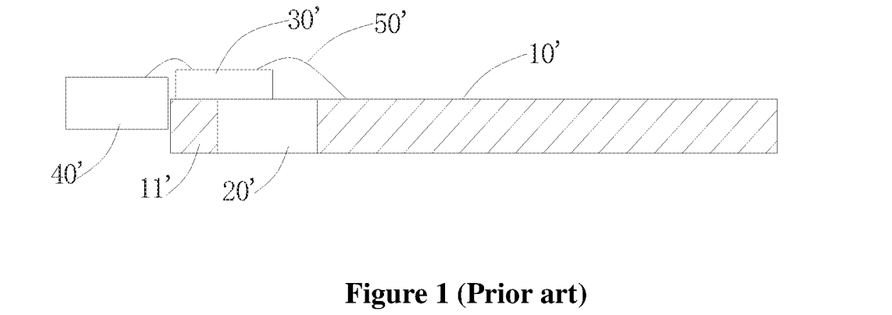
FIG. 1 is a diagram illustrating a circuit board and an optical module according to an existing technology.

FIG. 1 is a diagram illustrating a circuit board and an optical module according to an existing technology. As illustrated in FIG. 1, embedding copper inside a board can usually achieve good heat dissipation and, in general, meet heat dissipation performance requirements of PCBs. However, a board frame 11' about 1 mm wide is usually required to surround the periphery of a circuit board 10' to provide support to a copper block 20'. When mounting a chip 30' to the edge of the circuit board 10', it is required to mount the chip 30' near the periphery of the circuit board 10' to reduce the wire bonding distance between the chip 30' and a silicon photonic integrated circuit 40'. As a result, the chip 30' is mounted at the 1 mm wide board frame 11' of the substrate area. In addition to the influence of the height difference between the circuit board 10' and the copper block 20', the contact area between the small-sized chip 30' and the copper block 20' is very small, which greatly reduces heat dissipation efficiency.

SUMMARY

A purpose of embodiments of present disclosure is to provide a circuit board and an optical module having that circuit board that are adapted to designs for mounting a chip, such as a silicon photonic integrated circuit, to the edge of the circuit board, thus providing good heat dissipation performance, reducing the wire bonding distance between chips, and facilitating a higher bandwidth for the entire link.

In order to achieve one of the aforementioned purpose, according to an embodiment of the present disclosure, a circuit board includes an upper surface, a lower surface, a first end surface connecting the upper surface and lower surface, and a heat dissipation block. The first end surface of the circuit board has an open slot, the open slot extending through the upper surface and lower surface, and the heat dissipation block being arranged inside the open slot. The heat dissipation block has a first surface, the first surface facing away from the lower surface of the circuit board and extending to the first end surface of the circuit board. The inside of the open slot has a stop structure, the stop structure preventing the heat dissipation block from moving toward the first end surface of the circuit board.

According to another embodiment of the present disclosure, an optical module includes a first chip, a second chip, and the circuit board with the heat dissipation block. The first chip is disposed on the heat dissipation block near the first end surface of the circuit board. The second chip is disposed on the side of the circuit board near the first end surface of the circuit board and the first chip.

The embodiments of the present application have the following benefits. (1) They provide special-shaped fitting structures for the heat dissipation block and circuit board, extend the heat dissipation block inside the circuit board to the edge of the circuit board, and mount the chip at the edge of the circuit board, thus minimizing the wire bonding distance from the chip to the photonic integrated circuit outside the circuit board and effectively increasing the heat dissipation performance of the circuit board. (2) They improve the stacking structure of the circuit board, decrease the difference between the height of the chip and the height of the solder pad of the PCB, and reduce the wire bonding distance between the chip and the solder pad of the PCB, thus facilitating a higher bandwidth for the entire link. (3) A thick copper layer may be electroplated on the circuit board and the heat dissipation block to provide a smooth transition between the different heights of the circuit board and heat dissipation block, thus providing a flat chip-mountable surface that has strong heat dissipation capability.

DETAILED DESCRIPTION

The text below provides a detailed description of the present application with reference to specific embodiments illustrated in the attached drawings. However, these embodiments do not limit the present application; the scope of protection for the present application covers changes made to the structure, method, or function by persons having ordinary skill in the art on the basis of these embodiments.

In order to facilitate the presentation of the drawings in the present application, the sizes of certain structures or portions have been enlarged relative to other structures or portions; therefore, the drawings in the present application are only for the purpose of illustrating the basic structure of the subject matter of the present application.

Additionally, terms in the text indicating relative spatial position, such as "upper surface," "above," "lower surface," "below," and so forth, are used for explanatory purposes in describing the relationship between a unit or feature depicted in a drawing with another unit or feature therein. Terms indicating relative spatial position may refer to positions other than those depicted in the drawings when a device is being used or operated. For example, if a device shown in a drawing is flipped over, a unit which is described as being located "below" or "under" another unit or feature will be located "above" the other unit or feature. Therefore, the illustrative term "below" may include positions both above and below. A device may be oriented in other ways (rotated 90 degrees or facing another direction), and descriptive terms that appear in the text and are related to space should be interpreted accordingly. When a component or layer is said to be "above" another part or layer or "connected to" another part or layer, it may be directly above the other part or layer or directly connected to the other part or layer, or there may be an intermediate component or layer.

Example Embodiment 1

Figure 2:
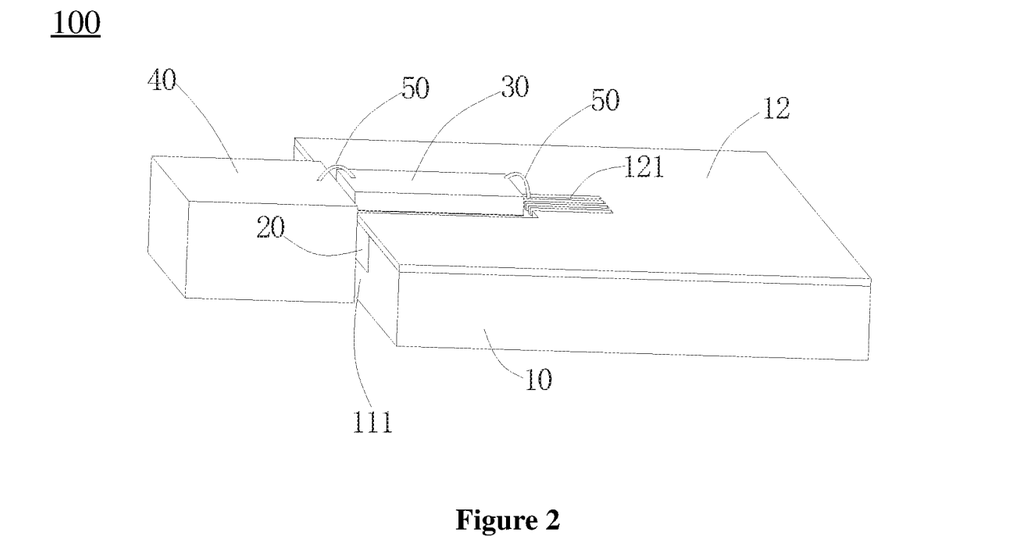
FIG. 2 is a diagram illustrating a perspective view of an optical module according to example embodiment 1 of the present disclosure.
Figure 3:
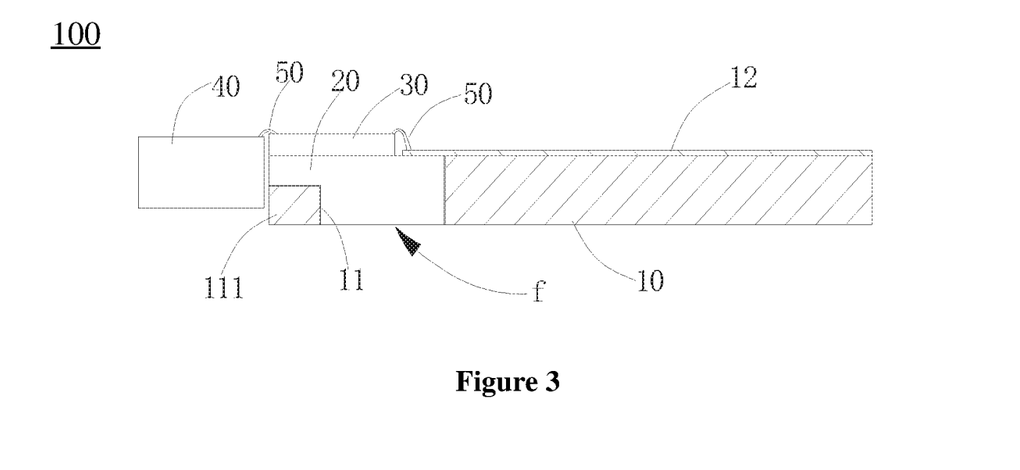
FIG. 3 is a diagram illustrating a cutaway view of the optical module in FIG. 2.
Figure 4:
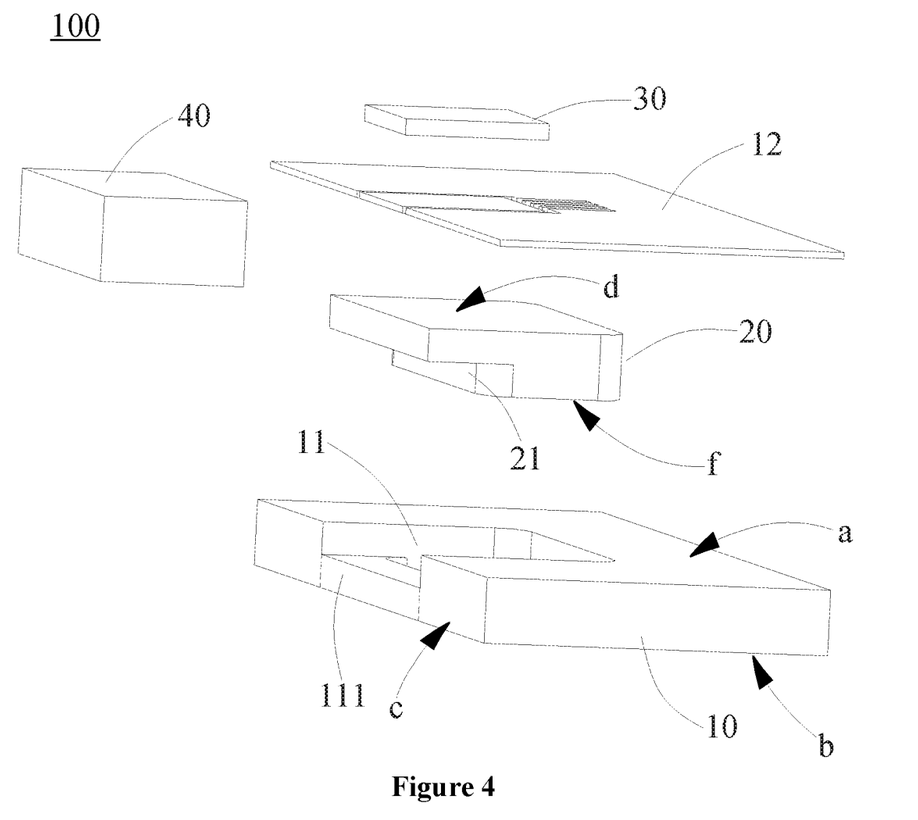
FIG. 4 is diagram illustrating an exploded view of the optical module in FIG. 2.

FIGS. 2 through 4 are diagrams illustrating an optical module 100 according to example embodiment 1 of the present disclosure. FIG. 2 is a perspective view of the optical module 100. FIG. 3 is a cutaway view of the optical module 100. FIG. 4 is an exploded view of the optical module 100. As shown in FIGS. 2 through 4, the optical module 100 includes a driver chip 30 (i.e., a first chip), a silicon photonic integrated circuit 40 (i.e., a second chip), and a circuit board 10. The circuit board 10 includes an upper surface a, a lower surface b, and a first end surface c connecting the upper surface a and the lower surface b. The first end surface c of the circuit board 10 has an open slot 11 that extends through the upper surface a and the lower surface b. A heat dissipation block 20 is arranged inside the open slot 11. The heat dissipation block 20 has a first surface d that faces away from the lower surface b of the circuit board 10 and extends to the first end surface c of the circuit board 10. Also arranged inside the open slot 11 is a stop structure that prevents the heat dissipation block 20 from moving toward the first end surface c of the circuit board 10.

A protruding portion 111 is arranged on at least one interior wall of the open slot 11. The heat dissipation block 20 has a groove 21 that matches the protruding portion 111. The protruding portion 111 forms the aforementioned stop structure. As illustrated in FIGS. 2 through 4, in this example embodiment, the protruding portion 111 of the open slot 11 and the groove 21 of the heat dissipation block 20 are located below the first surface d of the heat dissipation block 20. The protruding portion 111 connects the two side walls of the open slot 11, achieving good mechanical strength and providing strong support to the heat dissipation block 20. The heat dissipation block 20 of this structure has the largest first surface d and occupies less space in the circuit board 10. As a result, the heat dissipation block 20 provides good heat dissipation and occupies only a small area of wiring space in the circuit board 10.

The embodiment of the present disclosure designs special-shaped fitting structures for the heat dissipation block 20 and circuit board 10. As illustrated in FIGS. 3 and 4, the protruding portion 111 of the open slot 11 and the groove 21 of the heat dissipation block 20 of this example embodiment are located below the first surface d of the heat dissipation block 20. The protruding portion 111 is inserted inside the groove 21 of the heat dissipation block 20. The interior wall of the groove 21 abuts against the protruding portion 111 of the open slot 11 of the circuit board 10. The protruding portion 111 provides support to the heat dissipation block 20, thereby confining the heat dissipation block 20 inside the circuit board 10 and preventing the heat dissipation block 20 from loosening toward the first end surface c of the circuit board 10.

As mentioned previously, the optical module 100 of the present embodiment includes the driver chip 30 (i.e., the first chip), the silicon photonic integrated circuit 40 (i.e., the second chip), and the circuit board 10. The driver chip 30 is disposed on the heat dissipation block 20, being near the first end surface c of the circuit board 10. The silicon photonic integrated circuit 40 is disposed on the side of the circuit board 10, being near the first end surface c of the circuit board 10 and the driver chip 30. In this example embodiment, the first surface d of the heat dissipation block 20 is level with the upper surface a of the circuit board 10. A signal layer 12 is disposed on the upper surface a of the circuit board 10. A solder pad 121 is disposed on the signal layer 12. The driver chip 30 is electrically connected to the silicon photonic integrated circuit 40 and the solder pad 121 of the signal layer 12 by means of gold wires 50 or other conductive leads. When the circuit board 10 of the present embodiment is used, the heat dissipation block 20 inside the circuit board 10 extends to the edge of the circuit board 10, so that the driver chip 30 of the optical module 100 may be mounted at the edge of the circuit board 10 to be near the silicon photonic integrated circuit 40 to the greatest extent, and at the same time, the driver chip 30 may be mounted completely on the heat dissipation block 20. The heat generated by the driver chip 30 will directly pass through the heat dissipation block 20 to be dissipated by a third surface f of the heat dissipation block 20. The third surface f of the heat dissipation block 20 is usually level with the lower surface b of the circuit board 10. The first surface d of the heat dissipation block 20 provides the driver chip 30 mounted at the edge of the circuit board 10 with a flat chip-mountable surface that has strong heat dissipation capability. This circuit board structure provides the optical module 100 with good heat dissipation performance, and shortens the length of the gold wire 50 between the driver chip 30 and the silicon photonic integrated circuit 40 to the greatest extent, thus facilitating a higher bandwidth for the entire link.

Example Embodiment 2

Figure 5:
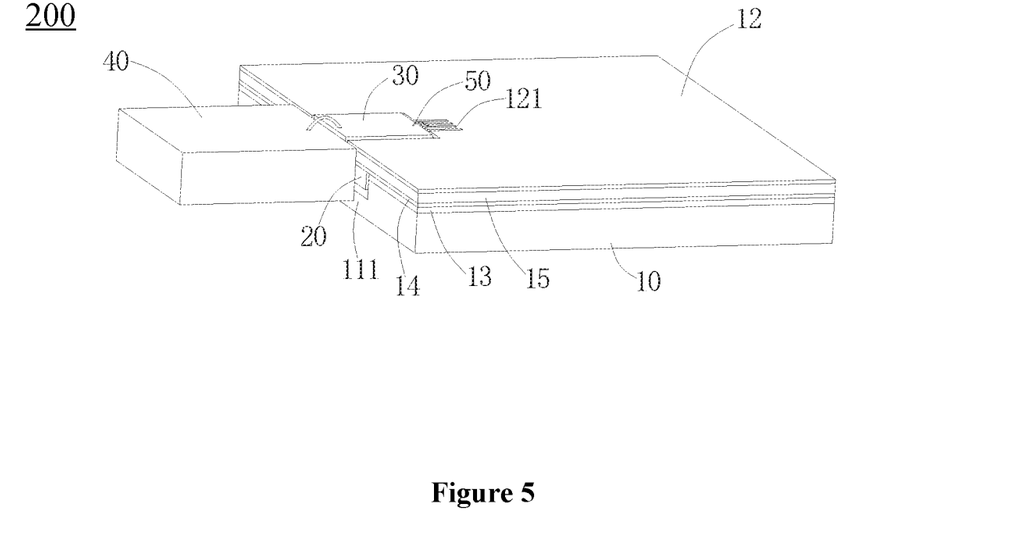
FIG. 5 is a diagram illustrating a perspective view of an optical module according to example embodiment 2 of the present disclosure.
Figure 6:
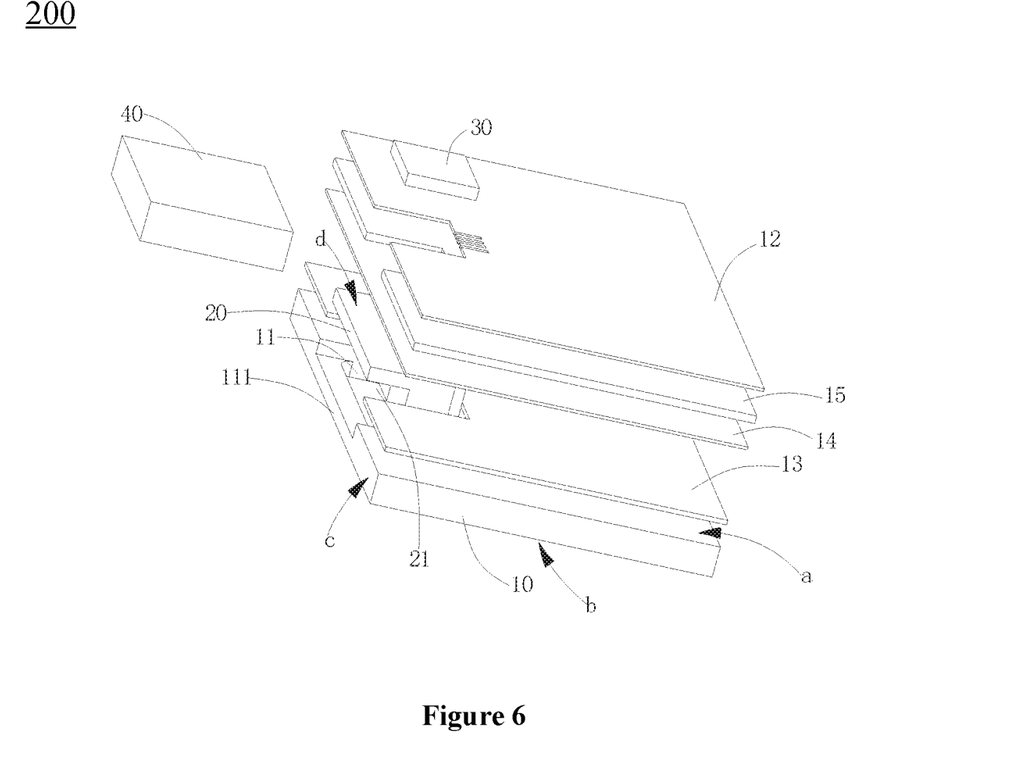
FIG. 6 is a diagram illustrating an exploded view of the optical module in FIG. 5.

FIGS. 5 and 6 are diagrams illustrating an optical module 200 according to an example embodiment 2 of the present disclosure. FIG. 5 is a perspective view of the optical module 200. FIG. 6 is an exploded view of the optical module 200. This example embodiment differs from example embodiment 1 in that a conductive layer 14 and an insulating dielectric layer 15 are arranged between the upper surface a of the circuit board 10 and the signal layer 12. In this example embodiment, the conductive layer 14 is arranged on the upper surface of the circuit board 10, the conductive layer 14 covering the heat dissipation block 20. The insulating dielectric layer 15 and a secondary conductive layer are arranged on the conductive layer 14. A mounting area is formed on the conductive layer 14 on the heat dissipation block 20. The mounting area extends to the first end surface c of the circuit board 10. The driver chip 30 is disposed on the mounting area. One layer of the insulating dielectric layer 15 and the signal layer 12 may be arranged on top of the conductive layer 14. Alternatively, a plurality of insulating dielectric layers 15 and a plurality of secondary conductive layers may be stacked alternatively on top of the conductive layer, the top secondary conductive layer being the signal layer 12. The signal layer 12 is close in height to the upper surface of the driver chip 30. When the signal layer 12 is level with the upper surface of the driver chip 30, the wire bonding distance from the driver chip 30 to the solder pad 121 of the signal layer 12 is shortest, facilitating a higher bandwidth for the entire link.

For example, copper may be directly plated onto the upper surface a of the circuit board 10 and the first surface d of the heat dissipation block 20, forming a continuous and complete electroplated copper layer to serve as the conductive layer 14. The electroplated copper layer is etched to have a pattern, to serve as a reference copper layer. Next, the reference copper layer is covered with the insulating dielectric layer 15, which is covered with a high-speed signal copper layer. The high-speed signal copper layer is etched to have a pattern, to serve as the signal layer 12. The insulating dielectric layer 15 and the signal layer 12 cover part of the conductive layer 14 on the heat dissipation block 20. A chip mounting area is reserved at a location on the first surface d of the heat dissipation block 20 that corresponds to the edge of the circuit board 10, or a chip mounting area is etched out of the high-speed signal copper layer and the insulating dielectric layer by means of laser ablation at a location corresponding to the heat dissipation block 20.

In example embodiment 1, the high-speed signal copper layer serving as the signal layer 12 cannot be overly thick due to the restricted size and spacing of the solder pad 121 on the signal layer 12; this renders the high-speed signal copper layer unable to provide a smooth transition between the upper surface a of the circuit board 10 and the heat dissipation block 20, possibly causing an electroplating seam between the heat dissipation block 20 and the upper surface a of the circuit board 10. When the structure of example embodiment 2 is used, the thickness of the reference copper layer that serves as the conductive layer 14 is not restricted because the solder pad need not be etched on this layer; thus, this example embodiment may provide a smooth transition between the upper surface a of the circuit board 10 and the heat dissipation block 20 by having a thick copper layer electroplated on their surfaces, thereby avoiding the problem of an electroplating seam. Furthermore, in comparison with example embodiment 1, the mounting surface of the driver chip 30 in example embodiment 2 is embedded to the location of the reference copper layer (i.e., the conductive layer 14); after the driver chip 30 is mounted, the height of the solder pad on the driver chip 30 is close to the height of the solder pad 121 on the signal layer 12, further shortening the wire bonding distance from the driver chip 30 to the solder pad of the signal layer 12, thus facilitating a higher bandwidth for the entire link and increasing the performance of high-speed signal transmission.

As illustrated in FIGS. 5 and 6, in example embodiment 2, a thick copper layer is electroplated on an original conductive layer 13 (e.g. an original reference copper layer) on the upper surface a of the circuit board 10 to serve as the reference copper layer. The original conductive layer 13 results from a circuit board manufacturing process. During the circuit board manufacturing process, a thin copper layer is plated on the surface of the circuit board to serve as the original reference copper layer and, at the same time, a thick copper layer is electroplated on the original reference copper layer to serve as the reference copper layer. This process is relatedly simple. The thick copper layer that serves as the conductive layer 14 may also be formed by removing the original conductive layer 13 (i.e., the original reference copper layer) and electroplating copper directly on the upper surface a of the circuit board 10 and the heat dissipation block 20 or by using other techniques.

Example Embodiment 3

Figure 7:
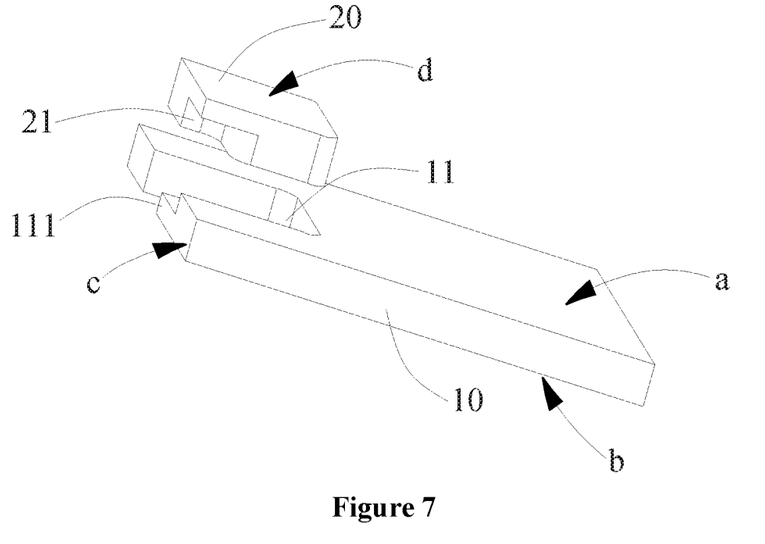
FIG. 7 is a diagram illustrating a fitting portion between a circuit board and a heat dissipation block in an optical module according to example embodiment 3 of the present disclosure.

FIG. 7 is a diagram illustrating a fitting portion between a circuit board 10 and a heat dissipation block 20 in an optical module according to example embodiment 3 of the present disclosure. The structures of the other portions in the optical module in example embodiment 3 are identical to those in example embodiment 1 or 2. Such structures do not appear in the drawings, and their descriptions will not be repeated here. Example embodiment 3 differs from example embodiment 1 or 2 in that the protruding portion 111 of the open slot 11 and the groove 21 of the heat dissipation block 20 are still located under the first surface d of the heat dissipation block 20, but the protruding portion 111 only connects to one side wall of the open slot 11 to form the aforementioned stop structure. The protruding portion 111 is inserted inside the groove 21 of the heat dissipation block 20, and the interior wall of the groove 21 abuts against the protruding portion 111 of the open slot 11 of the circuit board 10. The protruding portion 111 provides support to the heat dissipation block 20, thereby confining the heat dissipation block 20 inside the circuit board 10 and preventing the heat dissipation block 20 from loosening toward the first end surface c of the circuit board 10. Similar to example embodiment 1 or 2, the heat dissipation block 20 of example embodiment 3 has the largest first surface d, achieving good heat dissipation.

In example embodiment 3, the protruding portion 111 is only configured at one interior wall of the open slot 11. Alternatively, the protruding portion 111 may also be configured at each interior wall of the open slot 11 of the circuit board 10 to provide more reliable support to the heat dissipation block 20 from each direction.

Example Embodiment 4

Figure 8:
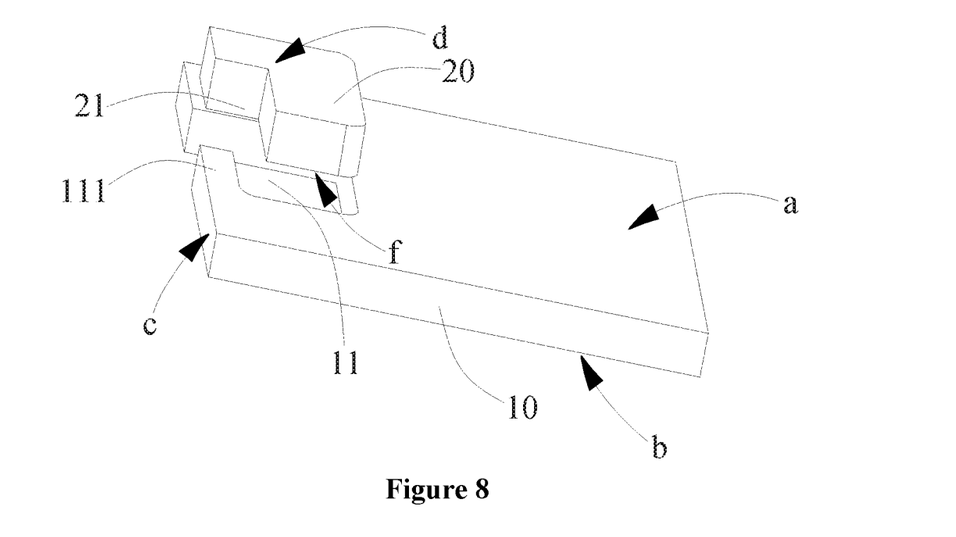
FIG. 8 is a diagram illustrating a fitting portion between a circuit board and a heat dissipation block in an optical module according to example embodiment 4 of the present disclosure.

FIG. 8 is a diagram illustrating a fitting portion between a circuit board 10 and a heat dissipation block 20 in an optical module according to example embodiment 4 of the present disclosure. The structures of the other portions in the optical module in example embodiment 4 are identical to those in example embodiment 1 or 2. Such structures do not appear in the drawings, and their descriptions will not be repeated here. Example embodiment 4 differs from example embodiment 1 or 2 in that the protruding portion 111 on the interior wall of the open slot 11 extends through the first surface d of the heat dissipation block 20. Similarly, the groove 21 on the heat dissipation block 20 extends through the first surface d of the heat dissipation block 20. The protruding portion 111 forms a stop structure. The protruding portion 111 is inserted inside the groove 21 of the heat dissipation block 20. The interior wall of the groove 21 abuts against the protruding portion 111 of the open slot 11 of the circuit board 10. The protruding portion 111 provides support to the heat dissipation block 20, thereby confining the heat dissipation block 20 inside the circuit board 10 and preventing the heat dissipation block 20 from loosening toward the first end surface c of the circuit board 10. In order to facilitate processing and production, the protruding portion 111 is connected to the upper surface a and the lower surface b of the circuit board 10, and the groove 21 of the heat dissipation block 20 extends through the first surface d and the third surface f of the heat dissipation block 20, the third surface f being the bottom surface of the heat dissipation block 20 opposite to the first surface d of the heat dissipation block 20.

Although the protruding portion 111 is only configured at one interior wall of the open slot 11 in each of the aforementioned example embodiments, the protruding portion 111 may also be configured at each interior wall of the open slot 11 of the circuit board 10 to provide more reliable support to the heat dissipation block 20 from each direction.

Example Embodiment 5

Figure 9:
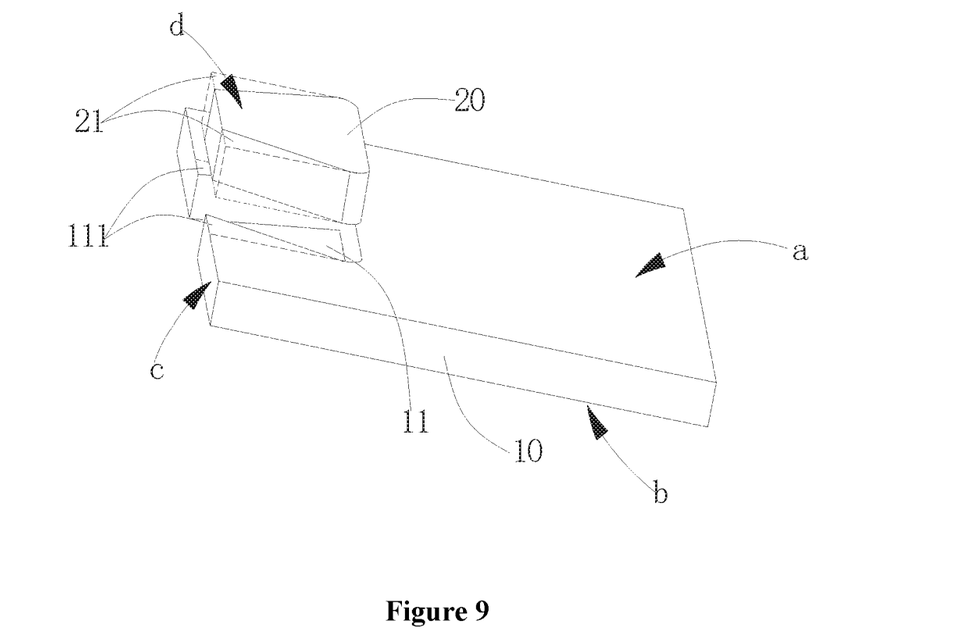
FIG. 9 is a diagram illustrating a fitting portion between a circuit board and a heat dissipation block in an optical module according to example embodiment 5 of the present disclosure.

FIG. 9 is a diagram illustrating a fitting portion between a circuit board 10 and a heat dissipation block 20 in an optical module according to example embodiment 5 of the present disclosure. Example embodiment 5 differs from each of the aforementioned example embodiments in that protruding portions 111 are arranged on both of the side walls of the open slot 11 of the circuit board 10, as illustrated in the diagram in FIG. 9 as triangular parts extending out from the side walls of the open slot 11 of the circuit board 10. Similarly, matching grooves 21 (illustrated in the diagram in FIG. 9 by dotted lines) are arranged on the two side surfaces of the heat dissipation block 20. The protruding portions 111 on the two side walls of the open slot 11 are respectively inserted inside the grooves 21 at the two side surfaces of the heat dissipation block 20, and the interior walls of the grooves 21 on the two side surfaces are abutted at the protruding portions 111 of the open slot 11 of the circuit board 10 to provide more reliable support to the heat dissipation block 20, thereby confining the heat dissipation block 20 inside the circuit board 10 and preventing the heat dissipation block 20 from loosening toward the first end surface c of the circuit board.

The quantity and shape of the grooves 21 of the heat dissipation block 20 and the protruding portion 111 on the interior walls of the open slot 11 of the circuit board 10 in each of the aforementioned example embodiments are not limited to the quantity and shape illustrated in each of the aforementioned example embodiments. Other regular or irregular shapes may also be used. A plurality of protruding portions 111 may also be configured on a single side wall of the open slot 11 at the same time. Alternatively, protruding portions 111 may be configured separately on two side walls of the open slot 11, and matching grooves 21 may be arranged on the heat dissipation block 20.

Example Embodiment 6

Figure 10:
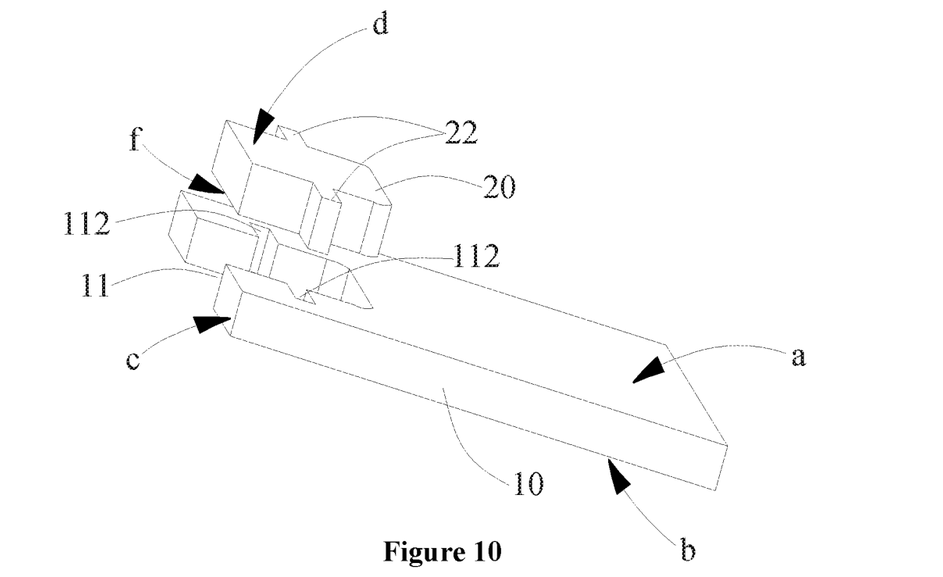
FIG. 10 is a diagram illustrating a fitting portion between a circuit board and a heat dissipation block in an optical module according to example embodiment 6 of the present disclosure.

FIG. 10 is a diagram illustrating a fitting portion between a circuit board 10 and a heat dissipation block 20 in an optical module according to example embodiment 6 of the present disclosure. The structures of the other portions in the optical module in example embodiment 6 are identical to those in example embodiment 1 or 2. Such structures do not appear in the drawings, and their descriptions will not be repeated here. Example embodiment 6 differs from example embodiment 1 or 2 in that an indentation 112 is arranged on at least one interior wall of the open slot 11 of the circuit board 10, and the heat dissipation block 20 has a protrusion 22 that matches the indentation 112. The protrusion 22 is inserted inside the indentation 112 on the interior wall of the open slot 11. The interior wall of the indentation 112 near the first end surface c of the circuit board 10 forms a stop structure to provide support to the heat dissipation block 20, thereby confining the heat dissipation block 20 inside the circuit board 10 and preventing the heat dissipation block 20 from loosening toward the first end surface c of the circuit board 10.

In this example embodiment, the indentation 112 on the interior wall of the open slot 11 extends through the upper surface a of the circuit board 10. In order to facilitate processing and production, the indentation 112 usually extends through the lower surface b of the circuit board 10 as well, but the indentation 112 does not have to extend through the lower surface b of the circuit board 10. Similarly, the protrusion 22 that is on the heat dissipation block 20 and matches the indentation 112 is usually connected to the first surface d and the third surface f of the heat dissipation block 20 as well, the third surface f being the bottom surface of the heat dissipation block 20 opposite to the first surface d of the heat dissipation block 20.

Example Embodiment 7

Figure 11:
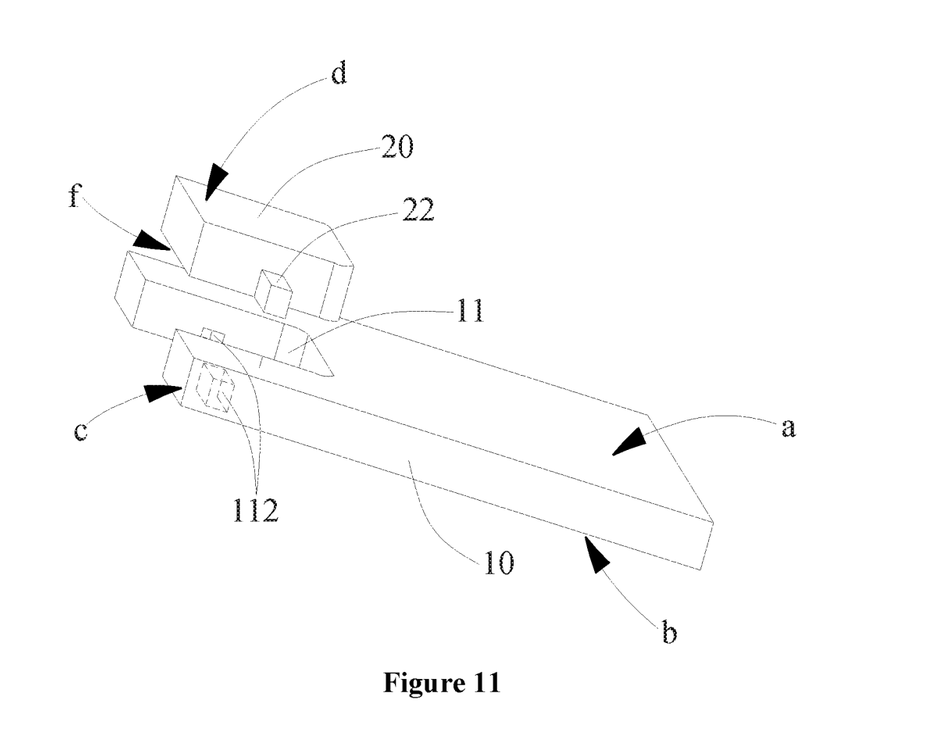
FIG. 11 is a diagram illustrating a fitting portion between a circuit board and a heat dissipation block in an optical module according to example embodiment 7 of the present disclosure.

FIG. 11 is a diagram illustrating a fitting portion between a circuit board 10 and a heat dissipation block 20 in an optical module according to example embodiment 7 of the present disclosure. Example embodiment 7 differs from example embodiment 6 in that the indentations 112 on interior walls of the open slot 11 of the circuit board 10 are disposed below the upper surface a of the circuit board 10. In other words, the indentations 112 do not extend through the upper surface a of the circuit board 10 but usually extend through the lower surface b of the circuit board 10. But the indentations 112 do not have to extend through the lower surface b of the circuit board 10. Similarly, the protrusions 22 that are on the heat dissipation block 20 and match the indentations 112 are not connected to the first surface d of the heat dissipation block 20. The protrusions 22 are disposed on the side walls of the heat dissipation block 20 near the third surface f of the heat dissipation block 20. The protrusions 22 of the heat dissipation block 20 are inserted inside the indentations 112 at the interior walls of the open slot 11. The interior walls of the indentations 112 near the first end surface c of the circuit board 10 form stop structures to provide support to the heat dissipation block 20, thereby confining the heat dissipation block 20 inside the circuit board 10 and preventing the heat dissipation block 20 from loosening toward the first end surface c of the circuit board 10.

In the aforementioned example embodiments 6 and 7, one indentation 112 is arranged on each of the two side walls of the open slot 11 of the circuit board 10; similarly, one protrusion 22 is arranged on each of the two side surfaces of the heat dissipation block 20 to match the aforementioned two indentations 112. The quantity of the indentations 112 on the interior walls of the open slot 11 of the circuit board 10 are not limited to two. There may be a single indentation or a plurality of indentations. Similarly, the protrusion 22 that matches the indentation 112 on the interior wall of the open slot 11 is arranged on the heat dissipation block 20. The shape of the protrusion 22 of the heat dissipation block 20 and the shape of the indentation 112 on the interior wall of the open slot 11 of the circuit board 10 are also not limited to the shapes in the aforementioned example embodiments; other regular or irregular shapes may also be used.

Example Embodiment 8

Figure 12:
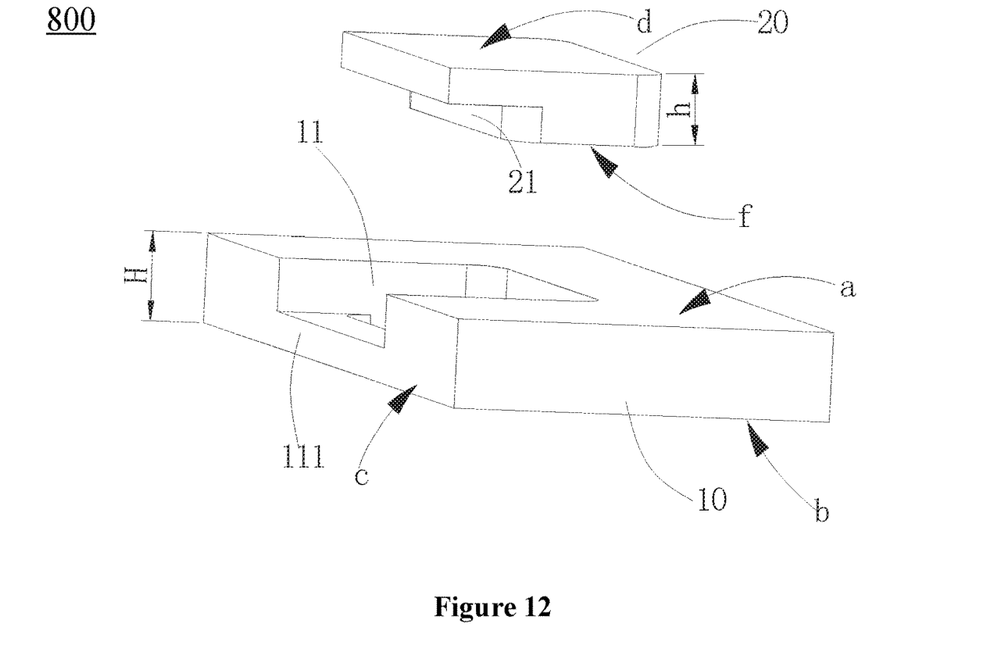
FIG. 12 is a diagram illustrating a fitting portion between a circuit board and a heat dissipation block in an optical module according to example embodiment 8 of the present disclosure.
Figure 13:
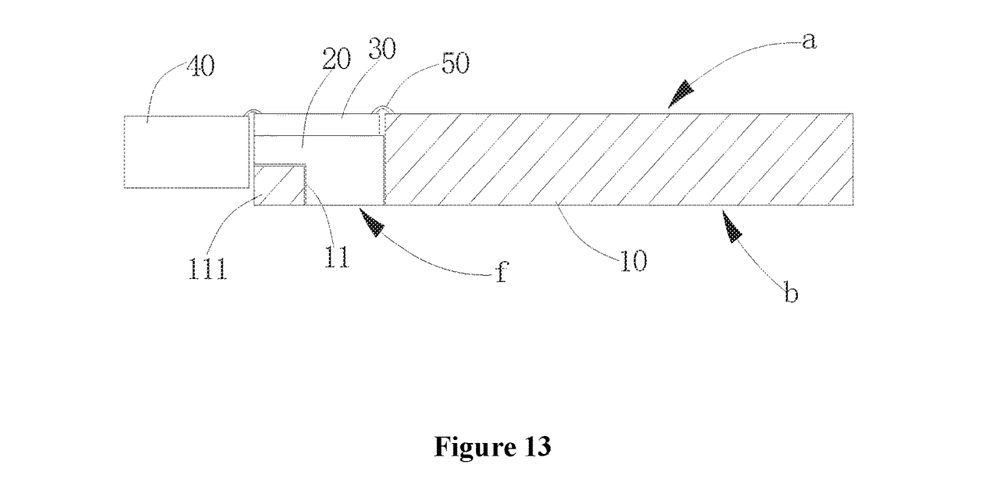
FIG. 13 is a structural diagram illustrating a cutaway view of the optical module according to example embodiment 8 of the present disclosure.

FIGS. 12 and 13 are diagrams illustrating an optical module 800 according to example embodiment 8 of the present disclosure. FIG. 12 is a structural diagram illustrating a part of a circuit board 10 in the optical module 800. FIG. 13 is cutaway view of the optical module 800. Example embodiment 8 differs from each of the previous example embodiments in that the upper surface a of the circuit board 10 is higher than the first surface d of the heat dissipation block 20, i.e., the height H of the circuit board 10 is greater than the height h of the heat dissipation block 20.

The optical module 800 of example embodiment 8 similarly includes a driver chip 30 (i.e., a first chip), a silicon photonic integrated circuit 40 (i.e., a second chip), and the circuit board 10. Here, the driver chip 30 is disposed on the heat dissipation block 20, being near the first end surface c of the circuit board 10. The silicon photonic integrated circuit 40 is disposed on the side of the circuit board 10, being near the first end surface c of the circuit board 10 and the driver chip 30. In example embodiment 8, the upper surface a of the circuit board 10 is higher than the first surface d of the heat dissipation block 20. Also disposed on the upper surface a of the circuit board 10 is a signal layer. A solder pad is on the signal layer; and the driver chip 30 is electrically connected to the silicon photonic integrated circuit 40 and the solder pad of the signal layer by means of gold wires 50 or other conductive leads. Similarly, the heat dissipation block 20 inside the circuit board 10 extends to the edge of the circuit board 10 so that the driver chip 30 and the silicon photonic integrated circuit 40 of the optical module may be mounted on the heat dissipation block 20. The heat generated by the driver chip 30 will pass directly through the heat dissipation block 20 to be dissipated by means of the third surface f of the heat dissipation block 20 at the lower surface b of the circuit board 10. The third surface f of the heat dissipation block 20 is usually level with the lower surface b of the circuit board 10. In example embodiment 8, the upper surface a of the circuit board 10 is higher than the first surface d of the heat dissipation block 20. After the driver chip 30 is mounted on the first surface d of the heat dissipation block 20, the height of the solder pad on the driver chip 30 is close to the height of the solder pad on the signal layer, further shortening the wire bonding distance from the driver chip 30 to the solder pad of the circuit board 10, thus facilitating a higher bandwidth for the entire link and increasing the performance of high-speed signal transmission.

The stop structure of example embodiment 8 is not limited to the form depicted in FIGS. 12 and 13, in which a protruding portion 111 configured on interior walls of an open slot 11 of the circuit board 10 matches a groove 21 on the heat dissipation block 20. The various forms of stop structures and their modifications in the aforementioned example embodiments 1 through 7 are applicable to example embodiment 8 as well. Such descriptions will not be repeated here.

The circuit board 10 in each of the aforementioned example embodiments may be a single-layer or a multilayer circuit board. The heat dissipation block 20 may be made of copper, heat conducting ceramics, or other heat conducting materials. The shapes of the heat dissipation block 20 and the grooves 21 or protrusions 22 of the heat dissipation block 20 are also not limited to the shapes mentioned in the aforementioned example embodiments. They may be a combination of the aforementioned shapes or be other regular or irregular shapes, such as a T-shape, a trapezoid, and so forth.

The optical module of the embodiments of the present disclosure includes a first chip, a second chip, and a circuit board of any of the aforementioned example embodiments. Here, the first chip is disposed on the heat dissipation block near the first end surface of the circuit board, and the second chip is disposed on the side of the circuit board near the first end surface of the circuit board and the first chip, providing good performance of heat dissipation and high-speed signal transmission. Here, the first chip and the second chip may be the driver chip and the silicon photonic integrated circuit of the previous example embodiments, or they may be other optoelectronic chips.

The series of detailed descriptions above is only intended to provide specific descriptions of feasible embodiments of the present application. They are not to be construed as limiting the scope of protection for the present application; all equivalent embodiments or changes that are not detached from the techniques of the present application in essence should fall under the scope of protection of the present application.

What is claimed is:

1. A circuit board, comprising:
   an upper surface;
   a lower surface;
   a first end surface connecting the upper surface and lower surface; and
   a heat dissipation block,
   wherein
   the first end surface of the circuit board has an open slot, the open slot extending through the upper surface and lower surface, and the heat dissipation block being arranged inside the open slot,
   the heat dissipation block has a first surface and a second surface, the first surface facing away from the lower surface of the circuit board and extending to the first end surface of the circuit board, the second surface being adjacent to the first surface and disposed in the same plane as the first end surface of the circuit board, and
   the inside of the open slot has a stop structure, the stop structure preventing the heat dissipation block from moving toward the first end surface of the circuit board.

2. The circuit board of claim 1, wherein a protruding portion is arranged on at least one interior wall of the open slot, the heat dissipation block has a groove that matches the protruding portion, and the protruding portion forms the stop structure.

3. The circuit board of claim 2, wherein the protruding portion of the open slot and the groove of the heat dissipation block are located below the first surface of the heat dissipation block.

4. The circuit board of claim 3, wherein the protruding portion connects two side walls of the open slot.

5. The circuit board of claim 2, wherein the protruding portion extends through the first surface of the heat dissipation block.

6. The circuit board of claim 1, wherein an indentation is arranged on at least one interior wall of the open slot, the heat dissipation block has a protrusion that matches the indentation, and an interior wall of the indentation near the first end surface of the circuit board forms the stop structure.

7. The circuit board of claim 6, wherein the indentation is disposed below the upper surface of the circuit board, or the indentation extends through the upper surface of the circuit board.

8. The circuit board of claim 1, wherein the first surface of the heat dissipation block is level with the upper surface of the circuit board.

9. The circuit board of claim 8, wherein a conductive layer is arranged on the upper surface of the circuit board, the conductive layer covering the heat dissipation block,
an insulating dielectric layer and a secondary conductive layer are arranged on the conductive layer, and
a mounting area is formed on the conductive layer on the heat dissipation block, the mounting area extending to the first end surface.

10. The circuit board of claim 1, wherein the upper surface of the circuit board is higher than the first surface of the heat dissipation block.

11. An optical module, comprises:
a first chip;
a second chip; and
the circuit board of claim 1,
wherein
the first chip is disposed on the heat dissipation block near the first end surface of the circuit board, and
the second chip is disposed on the side of the circuit board near the first end surface of the circuit board and the first chip.

12. The optical module of claim 11, wherein
the upper surface of the circuit board is level with the first surface of the heat dissipation block,
a conductive layer is arranged on the upper surface of the circuit board, the conductive layer covering the heat dissipation block, an insulating dielectric layer and a secondary conductive layer being arranged on the conductive layer,
a mounting area is formed on the conductive layer on the heat dissipation block, the mounting area extending to the first end surface, and the first chip being disposed on the mounting area, and
the top secondary conductive layer is a signal layer, the signal layer being level with the upper surface of the first chip.

13. The optical module of claim 11, wherein the upper surface of the circuit board is level with the upper surface of the first chip.

* * * * *

UNITED STATES PATENT AND TRADEMARK OFFICE
CERTIFICATE OF CORRECTION

PATENT NO. : 10,880,987 B2
APPLICATION NO. : 16/527257
DATED : December 29, 2020
INVENTOR(S) : Xigui Fang et al.

It is certified that error appears in the above-identified patent and that said Letters Patent is hereby corrected as shown below:

On the Title Page

Item (30), under "Foreign Application Priority Data," "2018 1 0861266" should read
--2018 1 0861266.3--.

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*